United States Patent [19]
Fujiwara et al.

[11] 4,360,919
[45] Nov. 23, 1982

[54] SEMICONDUCTOR LIGHT EMITTING DEVICE

[75] Inventors: Takao Fujiwara; Kiyoshi Hanamitsu, both of Sagamihara; Sigeo Ohsaka, Kawasaki; Hiroshi Ishikawa, Tokyo; Nobuyuki Takagi, Yokohama; Katsuharu Segi, Kawasaki, all of Japan

[73] Assignee: Fujitsu Limited, Kawasaki, Japan

[21] Appl. No.: 185,806

[22] Filed: Sep. 10, 1980

[30] Foreign Application Priority Data

Sep. 11, 1979 [JP] Japan .................. 54-116320

[51] Int. Cl.$^3$ ............................. H01S 3/19
[52] U.S. Cl. ...................... 372/45; 357/17; 372/46; 372/48
[58] Field of Search ............. 331/94.5 H; 357/17, 357/18; 372/45, 46, 48

[56] References Cited
U.S. PATENT DOCUMENTS
4,329,660 5/1982 Yano et al. ............... 372/46

OTHER PUBLICATIONS
Aiki et al., "Transverse Mode Stabilized Al$_x$Ga$_{1-x}$As Injection Lasers with Channeled-Substrate-Planar Structure", *JQE*, vol. QE14, No. Feb. 1978, pp. 89-94.

Primary Examiner—James W. Davie
Attorney, Agent, or Firm—Staas & Halsey

[57] ABSTRACT

An improved semiconductor light emitting device having a stabilized lateral mode oscillation and device current.

In the present invention, a current rejecting layer and an etch-back preventive layer are added to a semiconductor laser provided with a clad layer composed of a projecting portion for confining light from an active layer and a portion for passing the light. The thicknesses of the layers, the relationships of forbidden band widths of the layers and their conductivity type are all specified. An easily manufactured semiconductor laser with an excellent current limit function and optical guide function are obtained and the lateral mode oscillation oscillation is stable.

18 Claims, 13 Drawing Figures

SEMICONDUCTOR LIGHT EMITTING DEVICE

BACKGROUND OF THE INVENTION

1. Field of the Invention

This invention relates to a semiconductor light emitting device, and more particularly to improvement in a semiconductor laser which is suitable for use as a light source, for example, for optical communication.

2. Description of the Prior Art

Figure 1:
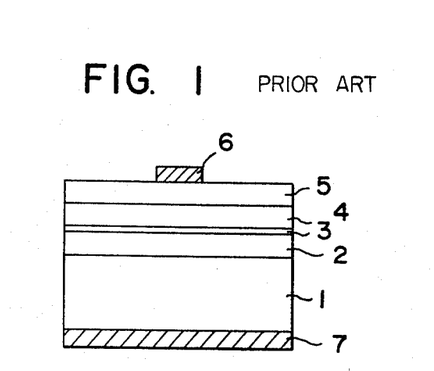
FIG. 1 is a sectional view showing the principal part of an example of a conventional device.

FIG. 1 shows a known semiconductor laser device.

In FIG. 1, reference numeral 1 indicates an n type GaAs substrate; 2 designates an n type $Ga_{0.7}Al_{0.3}As$ clad layer; 3 identifies a GaAs active layer; 4 denotes a p type $Ga_{0.7}Al_{0.3}As$ clad layer; 5 represents a p type GaAs layer; 6 shows an electrode on the positive side; and 7 refers to an electrode on the negative side.

In a conventional semiconductor laser, as shown in FIG. 1, as the current increases the light emitting region spreads, resulting in a lateral oscillation mode becoming unstable. The reason for the instability is that there is no mechanism for stabilizing the lateral mode other than a difference in the gain of the current distribution.

Figure 2:
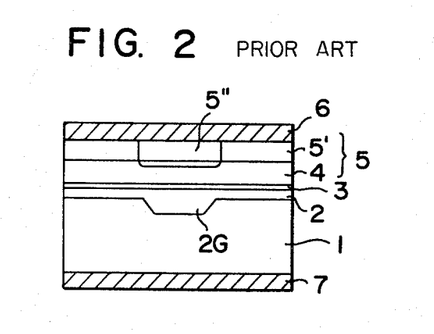
FIG. 2 is a sectional view showing the principal part of another example of the conventional device.

In order to overcome this instability defect of the prior art, there has been proposed a semiconductor laser constructed as shown in FIG. 2, in which parts corresponding to those in FIG. 1 are identified by the same reference numerals.

The semiconductor laser of FIG. 2 differs from the semiconductor laser of FIG. 1 in that the clad layer 2 has a projecting portion 2G and in that the clad layer 2 outside of the projecting portion 2G is thinner than the corresponding layer of the FIG. 1 device. The cap layer 5 is composed of an n type GaAs portion 5' and a p type GaAs region 5" for defining therein a current path.

In the semiconductor laser of FIG. 2, light emitted from the active layer 3 travels out of the clad layer 2 outside of the projecting portion 2G and is absorbed and reflected by the n type GaAs substrate 1. That is, the effective refractive index in the portion outside of the stripe region, except the projecting portion 2G, is varied and the loss in that portion is increased. Therefore, the oscillation region is restricted to the portion corresponding to the projecting portion 2G which acts as an optical guide mechanism, and stabilizes the lateral oscillation mode.

Figure 6:
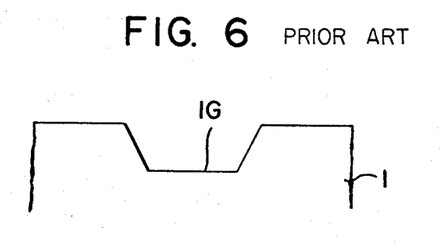
FIG. 6 is a sectional view showing the principal part of another example of the conventional device.
Figure 7:
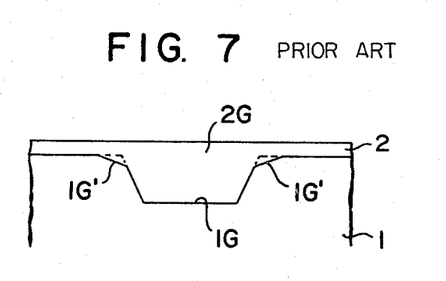
FIG. 7 is a sectional view of the principal part of another example of the conventional device.

However, the manufacture of this semiconductor laser poses some problems. The clad layer 2 is formed on the substrate 1 in which a recess is made prior to the formation of the clad layer 2. Since the clad layer 2 is very thin except for the projecting portion 2G, there is a possibility that the clad layer 2 sags in the area of the recess in the substrate 1, thus, causing the active layer 3 to curve. If the clad layer 2 is formed thick to avoid this problem, the light guide effect is lost. Another problem is the difficulty in obtaining the desired shape of the recess formed in the substrate 1. That is, in the case where a recess 1G is initially formed in the substrate 1 as shown in FIG. 6, and then the clad layer 2 is formed by liquid phase epitaxy on the substrate 1, as shown in FIG. 7, the edge of the recess 1G (indicated by the broken lines) is rounded into a gentle slope 1G'. The reason for this is as follows. During the formation of the liquid phase epitaxy layer, the layer flows over the edge of the recess 1G so, that when the growth solution makes contact with the substrate 1, the edge of the recess 1G is liable to be etched back into the solution. When the gentle slope 1G' is formed and the projecting portion 2G of the clad layer 2 also conforms to the recess 1G, the light emitting region becomes wider as current flows, thus making it impossible to control the region of oscillation. Still another problem is that it is very difficult to form the p type GaAs region 5" so that it is in alignment with projecting portion 2G. If they are not aligned, a current which does not contribute to increases in oscillation, to an increase in threshold current or the effective operating current, introduces non-uniformity in the light emission in the lateral direction and changes the light emitting region.

Figure 3:
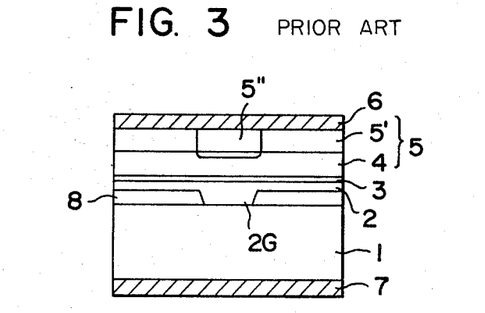
FIG. 3 is a sectional view showing the principal part of another example of the conventional device.

FIG. 3 illustrates another conventional semiconductor laser, constructed differently than the semiconductor laser of FIG. 2. The difference is that the n type GaAs substrate 1, of FIG. 3, is formed flat without a recess; a p type GaAs current preventing layer 8 is formed on the substrate 1; after a groove is formed in the layer 8, the clad layer 2 is grown on the layer 8 forming the projecting portion 2G in the groove.

This semiconductor laser has the same defects as those of the FIG. 2 device, except the current confinement problem. In addition, the p type GaAs current preventing layer 8, considered an advantage over the semiconductor laser of FIG. 2, is of no use in practice. In order for the laser device of FIG. 3 to serve as one having an optical guide mechanism, it is necessary that the p type GaAs current preventing layer 8 absorb light of the active layer 3 travelling out of the clad layer 2. Then, in the current preventing layer 8 electrons and holes are generated by the light absorption and only number of holes is gradually increased. This is equivalent to the application of forward bias voltage to the current preventing layer 8 with respect to the n type GaAs substrate 1 and the n type GaAlAs clad layer 2. When the number of holes has been increased, the current preventing layer 8 is biased to a potential substantially equal to a diffusion potential between the substrate 1 and the clad layer 2. When the current preventing layer 8, is not sufficiently thick as compared with the diffusion length of minority carries, electrons in the substrate 1 flow into the clad layer 2 through the current preventing layer 8, so that the current preventing layer 8 does not perform its function. The diffusion length of minority carriers varies with the carrier concentration in the range of 1 to 3 $\mu$m for GaAs. To ensure that the current preventing layer performs its function, it must be between 5 to 10 times thicker than the diffusion length of minority carriers. It is difficult to achieve current preventing layer 8 thicknesses of up to 10 $\mu$m and still form by means of etching a 6 $\mu$m groove 2G, or to maintain the distance between the active layer 3 and the current preventing layer 8 in the range of up to 0.4 $\mu$m, while keeping the active layer 3 flat. If the current preventing layer 8 and the active layer 3 are spaced a distance of 1 $\mu$m or more so as to prevent the current preventing layer 8 from absorbing light, the layer 8 performs the current preventing function, but the optical guide function is lost.

Figure 4:
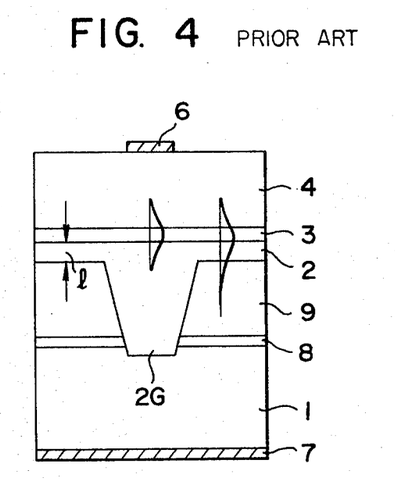
FIG. 4 is a sectional view showing the principal part of another example of the conventional device.

A conventional semiconductor laser shown in FIG. 4 is also known in the art. In FIG. 4, parts corresponding to those in FIGS. 1, 2, and 3 are identified by the same reference numerals.

In FIG. 4, reference numeral 8 indicates a p type GaAlAs current preventing layer; and 9 designates a p or n type GaAs layer.

Figure 5:
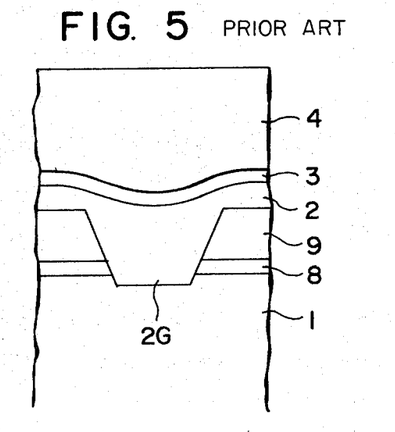
FIG. 5 is a sectional view showing the principal part of another example of the conventional device.

One of the defects of this semiconductor laser is an increase in the threshold current. That is, since a loss guide system in which light is absorbed by the GaAs layer 9 on the outside of the stripe region is used, light is guided only in the stripe, thus increasing threshold current. Another defect is that the active layer 3 becomes hollow and cannot be made flat, as shown in FIG. 5. The reason is that since the value l shown in FIG. 4 must be selected to be, for example, 0.3 μm or less for guiding light, the active layer 3 is exposed directly to the influence of the groove. Still another defect is that since the GaAs layer 9 is thick, the gentle slope 1G', discussed with reference to FIGS. 6 and 7, is produced as in the cases of the other conventional devices.

At present, many studies are being made so as to overcome the abovesaid defects of the prior art. For example, there has been proposed to form the clad layer 2 to a thickness of up to 0.3 μm (except the projecting portion 2G) and define the supersaturation degree of the growth solution, the cooling rate, the time for growing the active layer 3 and so forth, in order to grow the layer 3 flat. However, the manufacture of the semiconductor laser under such restricted conditions involves control difficulties. For example, an increase in the supersaturation degree of the growth solution suppresses the etching-back of the edge of the recess during the formation of the clad layer, but causes an increase in the growth speed. Accordingly, the clad layer tends to be thick, thus increasing the distance between the active layer and the substrate and resulting in the loss of the optical guide function.

SUMMARY OF THE INVENTION

The present invention provides a semiconductor laser free from the abovesaid defects of the prior art. A semiconductor laser equipped with a current confining region effective at all times together with an optical guide function unobtainable with the prior art, and which is easy to manufacture is presented and capable of stable oscillation in the lateral mode.

This object can be achieved by a semiconductor light emitting device comprising a first growth layer of a low refractive index, a second growth layer of a high refractive index serving as the active layer, and a third growth layer of a low refractive index. The layers are formed on a semiconductor compound substrate having formed therein a stripe shape hollow and a current confining barrier set up around the hollow. The first growth layer, the intermediate layer of a high refractive index and the low refractive index layer are formed on the surface of the substrate except in the hollow. This formation establishes a specified light mode cooperating with the light mode established by the active layer to confine the emitted light is. The confinement is due to the difference in the effective refractive index between the portion of the active layer overlying the hollow and the remaining portion of the active layer.

DESCRIPTION OF THE PREFERRED EMBODIMENTS

Figure 8:
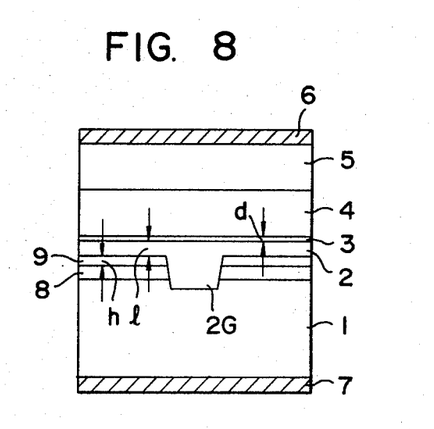
FIG. 8 is a sectional view of the principal part of an embodiment of the present invention.

FIG. 8 illustrates the principal part of an embodiment of the semiconductor light emitting device of the present invention. In FIG. 8, parts corresponding to parts in the prior figures, are identified by the same reference numerals.

In the illustrated embodiment, an etch-back preventive layer 9 is formed in addition to the current preventing layer 8 and the forbidden band width of a predetermined layer is selected to be a certain value. The etch-back preventive layer 9 is an n type GaAlAs layer containing a predetermined amount of aluminum. The forbidden band widths of respective parts are represented as follows:

Substrate 1: $E_1$ (a sixth semiconductor layer)
Current preventing layer 8: $E_2$ (a fifth semiconductor layer)
Etch-back preventive layer 9: $E_3$ (a fourth semiconductor layer)
Clad layer 2 (including the projecting portion 2G): $E_4$ (a third semiconductor layer)
Active layer 3: $E_5$ (a first semiconductor layer)
Clad layer 4: $E_6$ (a second semiconductor layer)
Cap layer 5: $E_7$.

The forbidden band width $E_2$ is selected to be larger than $E_1$ and $E_3$. The substrate 1 is identical in conductivity type with the clad layer 2, while the current preventing layer 8 and the clay layer 4 are opposite in conductivity type to the substrate 1.

The current suppressing action of the present device is as follows.

When light emitted from the active layer 3 is absorbed by the etch-back preventive layer 9, holes and electrons are produced in the layer 9 some of which flow into the current preventing layer 8, biasing it in a forward direction with respect to the substrate 1. Since the forbidden band width of the current preventing layer 8 is larger than that of the substrate 1, majority carriers in the substrate 1 cannot flow into the current preventing layer 8. Accordingly, the majority carriers in the substrate 1 flow into the active layer 3, passing through the projecting portion 2G of the clad layer 2. Thus, the current flows only in the stripe region defined by the projecting portion 2G, and is prevented from flowing through the current preventing layer 8.

Next, a description will be given of the optical guide function in the present device.

Figure 9:
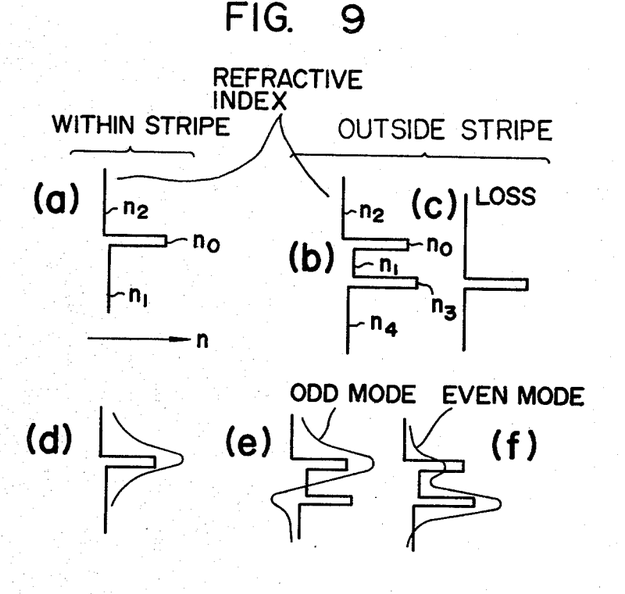
FIG. 9 shows the relationships between the refractive index and mode of the embodiment of FIG. 8.

FIG. 9 shows refractive index and loss distributions in the stripe region defined by the projecting portion 2G and in the region outside of the stripe region, vertical to junctions, in FIG. 8. FIG. 9 (a) shows the distribution of the refractive indexes of the layers 2 to 4 in the stripe region. FIG. 9 (b) shows the distribution of the refractive indexes of the layers 2 to 4, 8 and 9 outside of the stripe region, and FIG. 9 (c) shows the loss distributions. Because of the refractive index distributions, an even and an odd mode exist outside of the stripe region, as seen in FIGS. 9 (e) and 9 (f). Light in the stripe region is coupled mainly with the odd mode. In the odd mode, by reducing the thickness h of the etch-back preventive layer 9, the propagation constant is made small as compared with that of the stripe region (see FIG. 9 (d)) even if the thickness l of the clad layer 2 is large. Therefore, the effective refractive index outside of the stripe region is smaller than the effective refractive index in the stripe region. As a consequence, light is confined to the stripe region.

Figure 10:
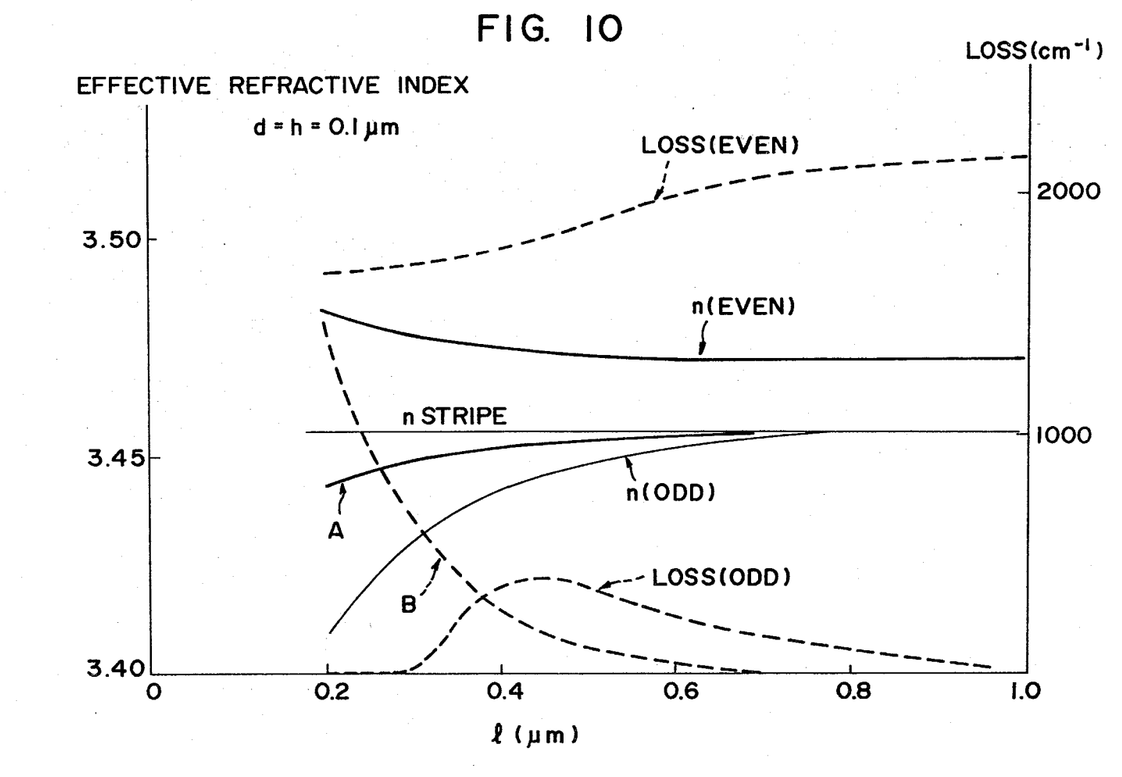
FIG. 10 graphically illustrates the effective refractive index and loss of the embodiment of FIG. 8.

FIG. 10 graphically illustrates the effective refractive index and the loss calculated from the odd mode and the even mode propagation constant in the stripe region, with $d = h = 0.1$ μm, d being the thickness of the active layer 3. The referenctive indexes of the respective layers were selected as follows:

Refractive index of active layer 3 $n_0 = 3.63$
Refractive index of clad layer 4 $n_1 = 3.44$
Refractive index of clad layer 2 $n_2 = 3.39$
Refractive index of etch-back preventive layer 9 $n_3 = 3.64$
Refractive index of current preventing layer 8 $n_4 = 3.44$ In general, the refractive index difference necessary to control the lateral mode must be a relative effective refractive index difference of about $3 \times 10^{-3}$. In FIG. 10, the solid-line curve A and the broken-line curve B, respectively, indicate the effective refractive index and the loss in the conventional device described previously in connection with FIGS. 4 and 5. In the device of FIG. 4, when the thickness l of the clad layer 2 is selected to be 0.3 μm, the effective refractive indexes inside and outside of the stripe region are substantially equal. On the other hand, the loss outside of the stripe region is as large as 800 cm$^{-1}$, which is in excess of 500 cm$^{-1}$ which is a loss necessary for guiding light. Accordingly, light is guided on the basis of the loss on the outside of the stripe region. This is contrast to the present invention, as is illustrated in FIG. 10. When the thickness l of the clad layer 2 is in the range of 0.2 to 0.4 μm, the loss is smaller than 450 cm$^{-1}$ and no light is guided because of the loss outside the stripe region. In other words, as the thickness l of the clad layer 2 decreases, the effective refractive index outside of the stripe region decreases, thus increasing the difference in the effective refractive index between the inside and the outside of the stripe region, which guides the light.

Figure 11:
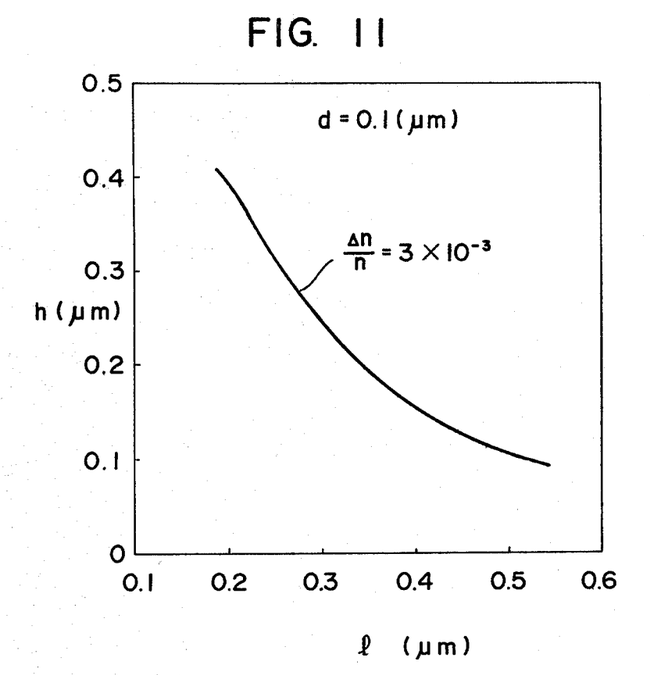
FIG. 11 graphically illustrates the relationship between l and h of the embodiment in FIG. 8.

Thus, the conventional device, illustrated by FIG. 4, utilizes the loss on the outside of the stripe region to guide light. In the present invention, the optical guide depends on the effective refractive index difference between the inside and the outside of the stripe region. In the present invention, a change in the effective refractive index is large with respect to the thickness l of the clad layer 2, and in the case where the thickness h of the etch-back preventive layer 9 is 0.1 μm, even if the thickness l of the clad layer 2 is 0.5 μm, the odd mode provides a relative effective refractive index difference of $3 \times 10^{-3}$. Accordingly, even if the thickness l of the clad layer 2 is large, effective confinement of light is possible. The fact that the thickness l of the clad layer 2 can be made large enables the active layer 3 to be formed flat, and hence is effective for enhancement of the yield in terms of crystal growth. With the thickness h of the etch-back preventive layer 9 selected large, the optical guide mechanism becomes similar to that of the conventional device shown in FIG. 2; namely, with a thickness h of 0.4 μm, the optical guide mechanism is substantially the same as that of the prior art device. Therefore, the thickness h of the etch-back preventive layer 9 should not be made so large. The relationship between h and l necessary for obtaining the relative effective refractive index of $3 \times 10^{-3}$ is such as shown in FIG. 11.

Next, a description will be given of the prevention of etch back in the present embodiment.

To prevent etch back in the present embodiment, the etch-back preventive layer 9 is provided, as shown in FIG. 8. Specifically, the etch-back preventive layer 9 is a $Ga_{1-x}Al_xAs$ layer, where $0.1 > X > 0$. In the prior art, no attention is paid to a difference between GaAs and $Ga_{1-x}Al_xAs$ containing the small amount of aluminum as indicated by $0.1 > X > 0$. In our experiments in a GaAs substrate having formed therein a recess and a $Ga_{1-x}Al_xAs$ ($0.1 > X > 0$) substrate also having formed therein a recess were subjected to the liquid phase epitaxial growth using an equilibrium solution. Two solutions were tried, a supersaturated solution having a supersaturation degree of 0.5 [°C.] and a supersaturated solution having a supersaturation degree of 1 [°C.]. The recess of the GaAs type substrate remained unchanged and without the etch back only when subjected to a solution having the supersaturation degree of 1 [°C.]. In contrast to this, the recess of the $Ga_{1-x}Al_xAs$ type substrate was not changed by either of the solutions. Also there was no sag in layer 9. These results were also obtained by forming a $Ga_{1-x}Al_xAs$ ($0.1 > X > 0$) layer on a GaAs substrate and then forming a recess in the layer extending to the substrate. The GaAs substrate was subjected to the liquid phase epitaxial growth using each of the abovesaid solutions. The edge of the recess in the etch-back preventive layer 9 is rounded only slightly, when the thickness h of the etch-back preventive layer 9 is smaller than 0.4 μm, even if no aluminum is added. Further, since the mixed crystal ratio of aluminum is large, the current preventing layer 8 is not etched back and does not substantially change its entire configuration.

Next, a description will be given of the manufacture of the semiconductor laser of the embodiment shown in FIG. 8.

To manufacture a semiconductor laser of the embodiment of FIG. 8, a p type $Ga_{0.7}Al_{0.3}As$ current preventing layer 8 is first formed by the liquid phase epitaxy to a thickness of between 0.5 and 1 μm on a silicon-doped GaAs substrate 1. The substrate is a (100) plane crystal with an electron concentration of between $1 \times 10^{17}$ and $5 \times 10^{18}$. Next, an n type $Ga_{0.99}Al_{0.01}As$ etch-back preventive layer 9 is similarly formed to a thickness of 0.1 to 0.4 μm on the current preventing layer 8.

By known photo lithography techniques, a groove between 2 and 10 μm wide, such as shown in FIG. 6, is formed in the substrate assembly, extending to the substrate 1.

After this, an n type $Ga_{0.7}Al_{0.3}As$ clad layer 2, a p type $Ga_{0.95}Al_{0.05}As$ active layer 3, a p type $Ga_{0.65}Al_{0.35}As$ clad layer 4, and a p type GaAs cap layer 5 are formed by the liquid phase epitaxy to thicknesses of between 0.2 and 0.5 μm (for the dimension indicated by l), 0.1 μm, 1 μm and 1 μm, respectively, on the substrate assembly.

Thereafter, electrodes 6 and 7 are deposited by a known method on the cap layer 5 and on the underside of the substrate 1, respectively. Then, the assembly is cleaved into individual chips about 300 μm long.

When the groove was 6 μm wide, the laser obtained, exhibited a threshold current density of 1.2 KA/cm² at room temperature. Further, the laser oscillated stably in the lateral mode of the least order and no kink appeared in the current vs. optical output characteristic. Moreover, when the etch-back preventive layer 9 was formed thin, an excellent characteristic was obtained even when the thickness l of the clad layer 2 was about 0.5 μm thick.

In the embodiment of FIG. 8, the thickness of the etch-back preventive layer 9 is selected to be 0.1 to 0.4 μm and the value x in $Ga_{1-x}Al_xAs$ is 0.01. The reason for selecting the thickness of the layer 9 in this range is that with a thickness less than 0.1 μm, the layer is too thin and difficult to form. Also, the minimum thickness of the layer 9 with which it is possible to obtain a relative effective refractive index difference of $3\times10^{-3}$ when the thickness l of the clad layer 2 is 0.2 μm, is 0.4 μm. With a thickness exceeding this value, the abovesaid specific refractive index difference cannot be obtained and the lateral mode is unstable. The value of x is not limited specifically to 0.1 and can be selected in the range of $0.1>X>0$. If the value x exceeds 0.1, an aluminum oxide film becomes rigid and the crystal to be grown thereon is imperfect.

Moreover, in the foregoing embodiment, the thickness of the clad layer 2 is selected to be 0.5 μm but this thickness can be selected in the range of 0.2 to 0.5 μm. With l<0.2 μm, the active layer 3 cannot be formed flat, and with l>0.5 μm, even if the etch-back preventive layer 9 is formed to the feasible minimum thickness, i.e., 0.1 μm, it is impossible to obtain the relative effective refractive index difference $3\times10^{-3}$ which is necessary for stabilizing the lateral mode.

Figure 12:
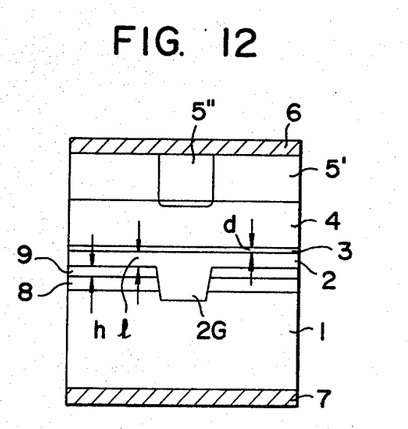
FIG. 12 is a sectional view of the principal part of a second embodiment of the present invention.

FIG. 12 illustrates in section the principal part of another embodiment of the present invention, in which parts corresponding to those in FIG. 8 are marked with the same reference numerals.

This embodiment differs from the embodiment of FIG. 8 in that a cap layer 5' is an n type GaAs layer, and in that zinc Zn is introduced in the cap layer 5' in a stripe pattern to form therein a p type GaAs region. In this embodiment, a slight misalignment of the p type GaAs region 5" and the projecting portion 2G does not present such problems as occur in the conventional devices shown in FIGS. 2 and 3. The reason is that since the current preventing layer 8 in the present invention effectively performs its function at all times, the defining of the current path is not such a strict function of the p type GaAs region 5". Accordingly, the manufacture of the device of this embodiment is not as difficult as the abovesaid prior art devices. In accordance with the present embodiment, when the groove was 6 μm wide, a threshold current density of 1.1 KA/cm² was obtained and the lateral oscillation mode was stable.

Further, a modified form of the embodiment of FIG. 8 was produced and, in this case, the current preventing layer 8 was a p type $Ga_{0.8}Al_{0.2}As$ layer and the same characteristics as those of the embodiment of FIG. 8 were obtained.

Figure 13:
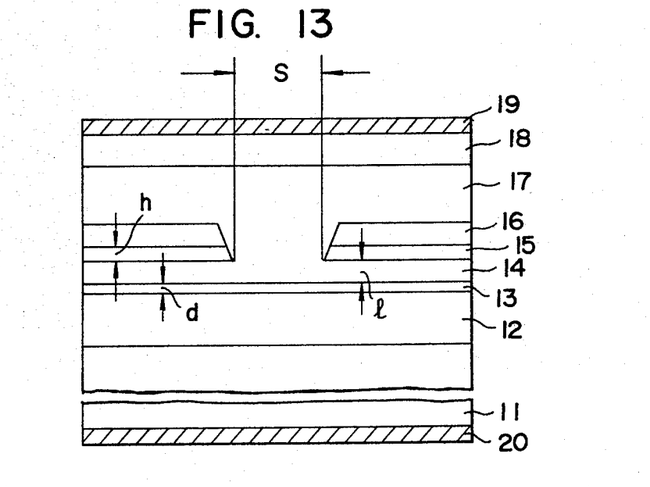
FIG. 13 is a sectional view of the principal part of a third embodiment of the present invention.

In the foregoing embodiments, the so-called ternary compound semiconductor is employed, but it is a matter of course that a quaternary compound can be used. FIG. 13 illustrates an example of a semiconductor laser using the quaternary compound. In FIG. 13, reference numeral 11 indicates an n type InP substrate (100 μm thick); 12 designates an n type InP layer (1.5 μm thick); 13 identifies an n type InGaAsP active layer (whose thickness is indicated by d); 14 denotes a pt type InP layer (whose thickness is indicated by l); 15 represents an n type InGaAsP layer (whose thickness is indicated by h); 16 shows an n type InGaAsP (or InP) layer (1 μm thick); 17 refers to a p type InP layer (1.5 μm thick); 18 indicates a p type InGaAsP layer (1 μm thick); 19 designates a Ti-Pt-Au electrode; 20 identifies an Au-Ge-Ni electrode; and S denotes the width of a stripe. In the above, the thicknesses d, l and h are 0.04 to 0.2 to 0.5 and 0.1 to 0.5 μm, respectively.

As will be appreciated from the foregoing description, according to the present invention, the current preventing layer and the etch-back preventive layer are added to a semiconductor laser provided with a clay layer composed of a projecting portion for confining light from an active layer and a portion for light travelling out of the clad layer, and the forbidden band width and the conductivity type of each layer are specified. In this way, it is possible to provide an easily manufactured semiconductor laser device having an excellent current limit function and optical guide function.

It will be apparent that many modifications and variations may be effected without departing from the scope of the novel concepts of this invention.

What is claimed is:

1. In a semiconductor light emitting device, the device comprising:
   a first growth layer having a low refractive index and a thickness l;
   an active layer comprising a second growth layer having a high refractive index; and
   a third growth layer of a low refractive index, all formed on a semiconductor compound substrate having a striped hollow formed therein and a current confining barrier formed around the hollow, said current confining barrier comprising:
   an intermediate layer having a high refractive index, and a thickness h, and a low refractive index layer being disposed on the surface of the substrate outside said hollow, whereby a first specified light mode is formed, such that with a second specified light mode formed by said active layer, light emitted from said active layer is essentially confined due to a difference in the effective refractive index between the portion of said active layer overlying said hollow and the remaining portion of said active layer.

2. A semiconductor light emitting diode device according to claim 1, wherein the thickness h of the intermediate layer of the high refractive index is 0.1 to 0.4 μm.

3. A semiconductor light emitting device according to claim 1, wherein the thickness l of the first growth layer on the intermediate layer is 0.2 to 0.5 μm.

4. In a semiconductor light emitting device, the device comprising:
   a first semiconductor layer, having a specified forbidden gap;
   a second semiconductor layer joined to one side of the first semiconductor layer and having a specified conductivity type and a larger forbidden gap than that of the first semiconductor layer;

a third semiconductor layer joined to the other side of the first semiconductor layer, having a larger forbidden gap than that of the first semiconductor layer, a conductivity type opposite that of the second semiconductor layer, a thickness l, and having a projecting portion formed on the side opposite that joined to the first semiconductor layer;

a fourth semiconductor layer joined to the third semiconductor layer except the projecting portion, having a smaller forbidden gap than that of the third semiconductor layer and a thickness h;

a fifth semiconductor layer joined to the fourth semiconductor layer, having a larger forbidden gap than that of the fourth semiconductor layer and a conductivity type opposite that of the third semiconductor layer; and a sixth semiconductor layer joined to the fifth semiconductor layer and the projecting portion having a forbidden gap smaller than that of the fifth semiconductor layer and a conductivity type opposite that of the fifth semiconductor;

wherein the thickness of the projecting portion of the third semiconductor layer is large enough to confine light emitted from the first semiconductor layer between the first layer and the sixth semiconductor layer; and the thickness of the third layer except the projecting portion is small enough to permit the light emitted from the first semiconductor layer to travel out of the fourth semiconductor layer.

5. A semiconductor light emitting device according to claim 4, wherein the fourth semiconductor layer is a $Ga_{1-x}Al_xAs$ with $0.1 > X \geqq 0$.

6. A semiconductor light emitting device according to claim 1, wherein the thickness of the fourth semiconductor layer is less than four times the thickness of the first semiconductor layer.

7. In a semiconductor light emitting device, the device comprising a semiconductor substrate:

a first clad layer of low refractive index, disposed on said substrate;

an active layer having a high refractive index, disposed on said first clad layer;

a second clad layer having a low refractive index, a thickness l, and specified conductivity type disposed on said active layer;

a first semiconductor layer formed within said second clad layer for defining a light emitting stripe, having a specified thickness h, and a higher refractive index than that of said second clad layer;

a second semiconductor layer formed within said second clad layer and on said first semiconductor layer, having a larger thickness than that of said first semiconductor layer, a lower refractive index than that of said first semiconductor layer, and a conductivity type opposite that of said second clad layer.

8. In a semiconductor light emitting device, the device comprising:

(a) a semiconductor compound substrate having a striped hollow formed therein;

(b) a current confining barrier formed on said substrate and around said hollow, said barrier including (i) a layer of low refractive index formed on said substrate; and (ii) an intermediate layer, having a high refractive index and thickness h, formed on said layer of low refractive index;

(c) a first growth layer, having low refractive index and a thickness l formed on said intermediate layer and in said region formed by said current confining barrier around said hollow;

(d) an active layer comprising a second growth layer having a high refractive index and formed on said first growth layer whereby a striped light confining region is formed in said first growth layer between said active layer and said hollow; and (e) a third growth layer having a low refractive index formed on said second growth layer;

wherein said current confining barrier and said first growth layer outside said hollow form a specified light mode such that light emitted by said active layer is confined within said active layer due to the difference in the effective refractive index between the portion of said active layer overlying said hollow and the remaining portion of said active layer.

9. In a semiconductor light emitting device, the device comprising:

(a) an active layer comprising a first semiconductor layer having a specified forbidden gap and a specified thickness;

(b) a second semiconductor layer joined to one side of said first layer, and having a larger forbidden gap than said forbidden gap of said first layer and a specified conductivity type;

(c) a third semiconductor layer, joined to the side of said first layer opposite that joined to said second layer, and having a larger forbidden gap than said forbidden gap of said first layer, a conductivity type opposite that of said second layer, a thickness l, and a projecting portion formed on the side opposite that joined to said first layer;

(d) a fourth semiconductor layer joined to said third layer, and having a smaller forbidden gap than that of said third layer, and a thickness h, less than the thickness of said projecting portion;

(e) a fifth semiconductor layer joined to said fourth layer, having a larger forbidden gap than said forbidden gap of said fourth layer, and a conductivity type opposite that of said third layer;

(f) a sixth semiconductor layer joined to said fifth layer and joined to said projecting portion of said third layer, and having a smaller forbidden gap than that of said fifth layer and a conductivity type opposite that of said fifth layer, whereby a striped light confining region is formed in said third layer, having a vertical length extending from said first layer to said sixth layer, and a horizontal length throughout said vertical length extending to the width of said projecting portion; and wherein said projecting portion of said third layer is of sufficient thickness to confine light emitted from said first layer, between said first layer and said sixth layer, and said third layer other than said projecting portion of said third layer is thin enough to permit light emitted from said first layer to pass into said fourth layer.

10. In a semiconductor light emitting device, the device comprising:

a semiconductor substrate;

a first clad layer having a low refractive index, disposed on said substrate;

an active layer having a high refractive index, disposed on said first clad layer;

a second clad layer having a low refractive index, a thickness l, and a specified conductivity type, disposed on said active layer;

a first semiconductor layer found within said second clad layer having a thickness h, for defining a striped light confining region within said second clad layer, and having a specified thickness and a larger refractive index than that of said second clad layer; and a second semiconductor layer disposed on said first semiconductor layer and within said second clad layer, and having a greater thickness than said specified thickness of said first layer, a lower refractive index than said refractive index of said first semiconductor layer and said second clad layer, and a conductivity type opposite that of said second clad layer.

11. A semiconductor light emitting device according to claim 1 or 8, wherein said intermediate layer is $Ga_{1-x}Al_xAs$ with $0.1 > X \geq 0$.

12. A semiconductor light emitting device according to claim 4 or 9, wherein said substrate comprises (100) plane crystal, and has an electron concentration in the range of between $1 \times 10^{17}$ and $5 \times 10^{18}$ cm$^{-3}$.

13. A semiconductor light emitting device according to claim 8, 9 or 10, wherein the width of said light confining region is in the range of between 2 and 10 μm.

14. A semiconductor light emitting device according to claim 8, 9 or 10, wherein said thicknesses h and l are selected such that the difference in the effective refractive index within said striped light confining region and the effective refractive index outside of said light confining region is $3 \times 10^{-3}$.

15. A semiconductor light emitting device according to claim 1, 4, 8 or 9, wherein the thickness of said active layer is 0.1 μm.

16. A semiconductor light emitting device according to claim 7 or 10, wherein the thickness of said active layer is selected to be in the range of between 0.04 and 0.2 μm.

17. A semiconductor light emitting device according to claim 1 or 8, further comprising:

a cap layer formed on a side of said third growth layer opposite said active layer, and having a conductivity opposite that of said low refractive index layer of said current confining barrier, and a striped region formed within said cap layer, oriented vertically over said striped hollow, and having a conductivity type opposite that of said cap layer and the same width as said light confining region.

18. A semiconductor light emitting device according to claim 4 or 9, further comprising:

a cap layer formed on a side of said second semiconductor layer opposite said active layer, and having a conductivity opposite that of said fifth semiconductor layer, and a striped region formed within said cap layer, oriented vertically over said projecting portion, and having a conductivity type opposite that of said cap layer and the same width as said light confining region.

* * * * *

UNITED STATES PATENT AND TRADEMARK OFFICE
CERTIFICATE OF CORRECTION

PATENT NO. : 4,360,919

DATED : November 23, 1982

INVENTOR(S) : Fujiwara et al.

It is certified that error appears in the above-identified patent and that said Letters Patent is hereby corrected as shown below:

Front page, [57] ABSTRACT, line 13, delete "oscillation".

Col. 1, line 65, delete ",".

Col. 2, line 9, after "rent" insert --,--;
line 30, after "only" insert --the--;
line 32, after "of" insert --a--.

Col. 3, line 53, delete "is" (first occurrence).

Col. 5, line 12, after "(d))" insert --,--;
line 22, "referenctive" should be --refractive--.

Col. 8, line 7, "pt" should be --p--;
line 20, "clay" should be --clad--;
line 54, delete "diode".

Col. 9, line 36, "1" should be --4--.

Col. 11, line 6, "found" should be --formed--.

Signed and Sealed this

Fifth Day of April 1983

[SEAL]

Attest:

GERALD J. MOSSINGHOFF

Attesting Officer *Commissioner of Patents and Trademarks*